(12) United States Patent
Gaudin et al.

(10) Patent No.: US 8,603,896 B2
(45) Date of Patent: Dec. 10, 2013

(54) METHOD FOR TRANSFERRING A MONOCRYSTALLINE SEMICONDUCTOR LAYER ONTO A SUPPORT SUBSTRATE

(75) Inventors: Gweltaz Gaudin, Grenoble (FR); Carlos Mazure, Bernin (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/559,396

(22) Filed: Jul. 26, 2012

(65) Prior Publication Data
US 2013/0029474 A1 Jan. 31, 2013

(30) Foreign Application Priority Data
Jul. 28, 2011 (FR) ...................................... 11 56885

(51) Int. Cl.
*H01L 21/30* (2006.01)
(52) U.S. Cl.
USPC .............. 438/458; 257/E21.09; 257/E21.133; 257/E21.134; 257/E21.567; 257/E21.568; 257/E21.601; 438/166; 438/455; 438/489; 438/491; 438/515
(58) Field of Classification Search
USPC ...................... 257/E21.09, E21.133, E21.134, 257/E21.567, E21.568, E21.601; 438/166, 438/455, 458, 489, 491, 515
See application file for complete search history.

(56) References Cited

U.S. PATENT DOCUMENTS

| | | | |
|---|---|---|---|
| 6,528,387 B1 | 3/2003 | Moriyasu et al. | 438/404 |
| 2005/0280155 A1 | 12/2005 | Lee | 257/758 |
| 2006/0068565 A1* | 3/2006 | Droes et al. | 438/458 |
| 2010/0044706 A1 | 2/2010 | Hebras | 257/52 |
| 2010/0216295 A1 | 8/2010 | Usenko | 438/470 |

FOREIGN PATENT DOCUMENTS

| | | |
|---|---|---|
| EP | 1 037 272 A1 | 9/2000 |
| WO | WO 2004/010481 A1 | 1/2004 |

OTHER PUBLICATIONS

French Search Report FR 1156885, dated Dec. 8, 2011.

* cited by examiner

*Primary Examiner* — Asok K Sarkar
(74) *Attorney, Agent, or Firm* — Winston & Strawn LLP

(57) ABSTRACT

A method for transferring a monocrystalline semiconductor layer onto a support substrate by implanting species in a donor substrate; bonding the donor substrate to the support substrate; and fracturing the donor substrate to transfer the layer onto the support substrate; wherein a portion of the monocrystalline layer to be transferred is rendered amorphous, without disorganizing the crystal lattice of a second portion of the layer, with the portions being, respectively, a surface portion and a buried portion of the monocrystalline layer; and wherein the amorphous portion is recrystallized at a temperature below 500° C., with the crystal lattice of the second portion serving as a seed for recrystallization.

17 Claims, 17 Drawing Sheets

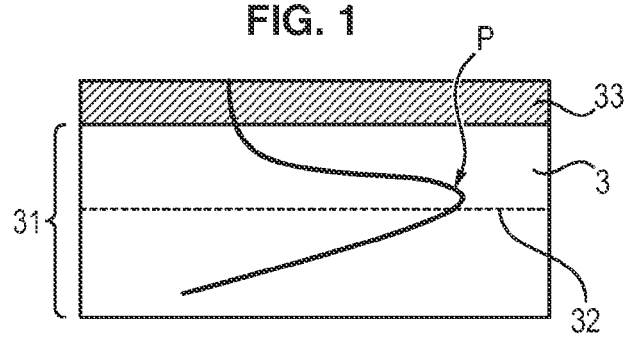
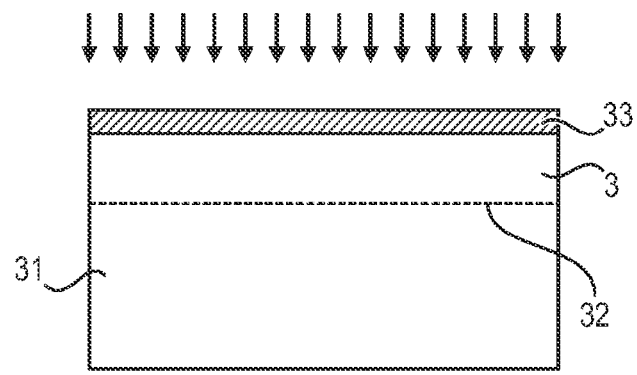
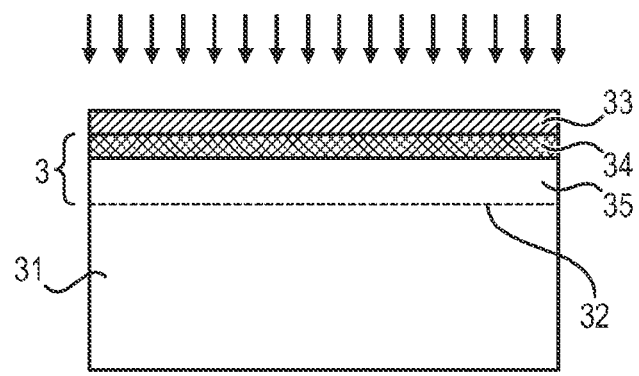

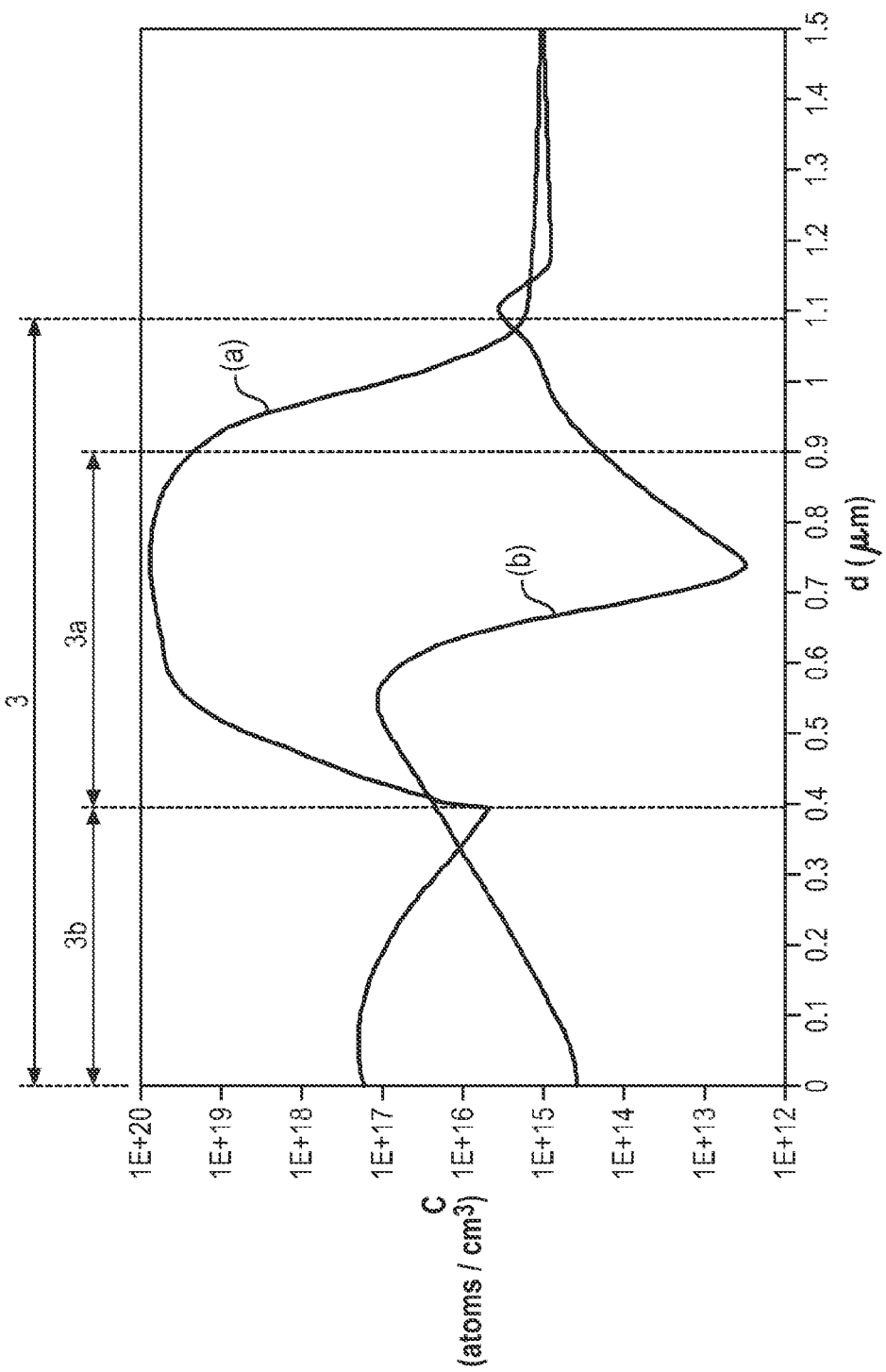

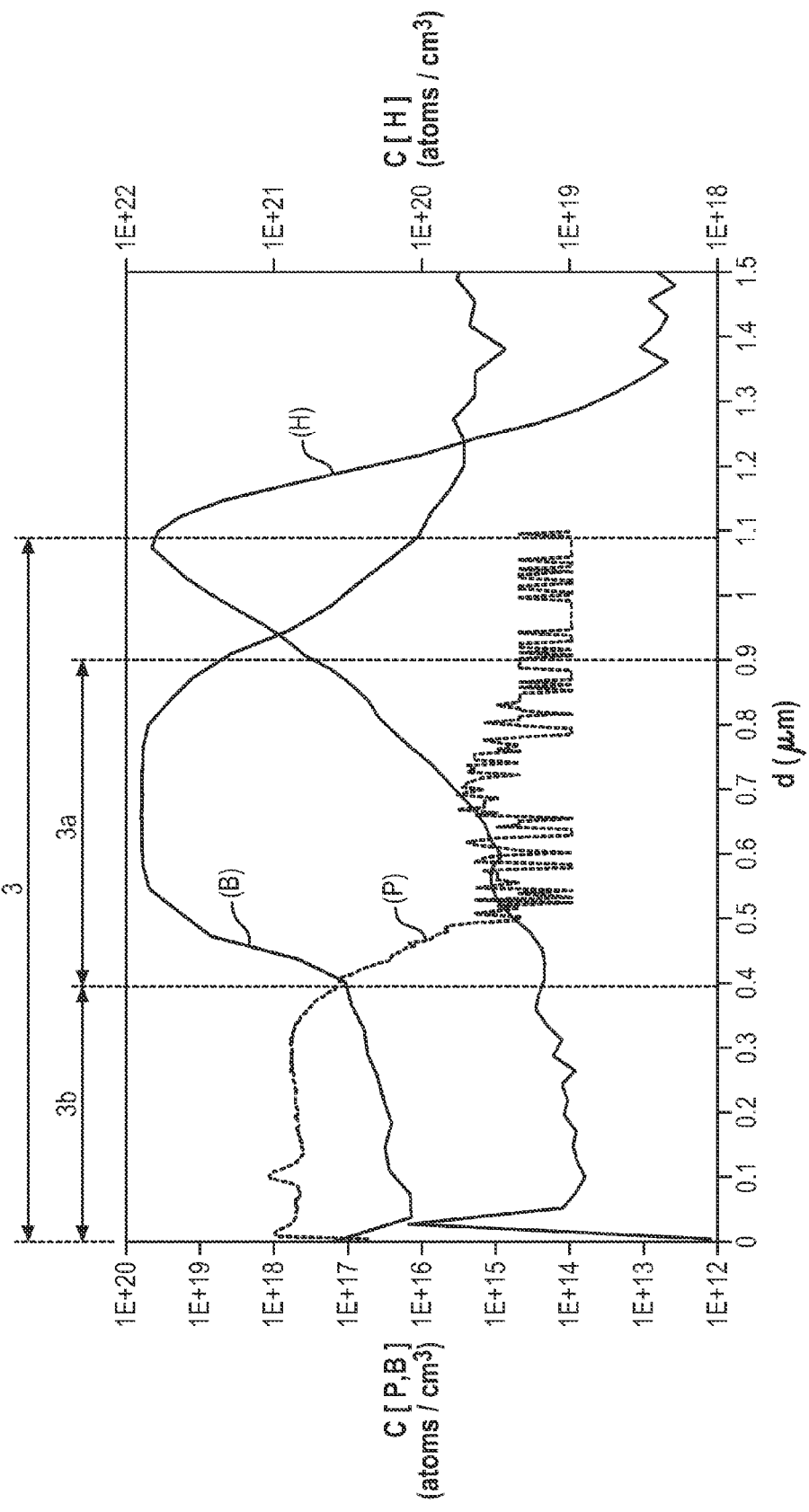

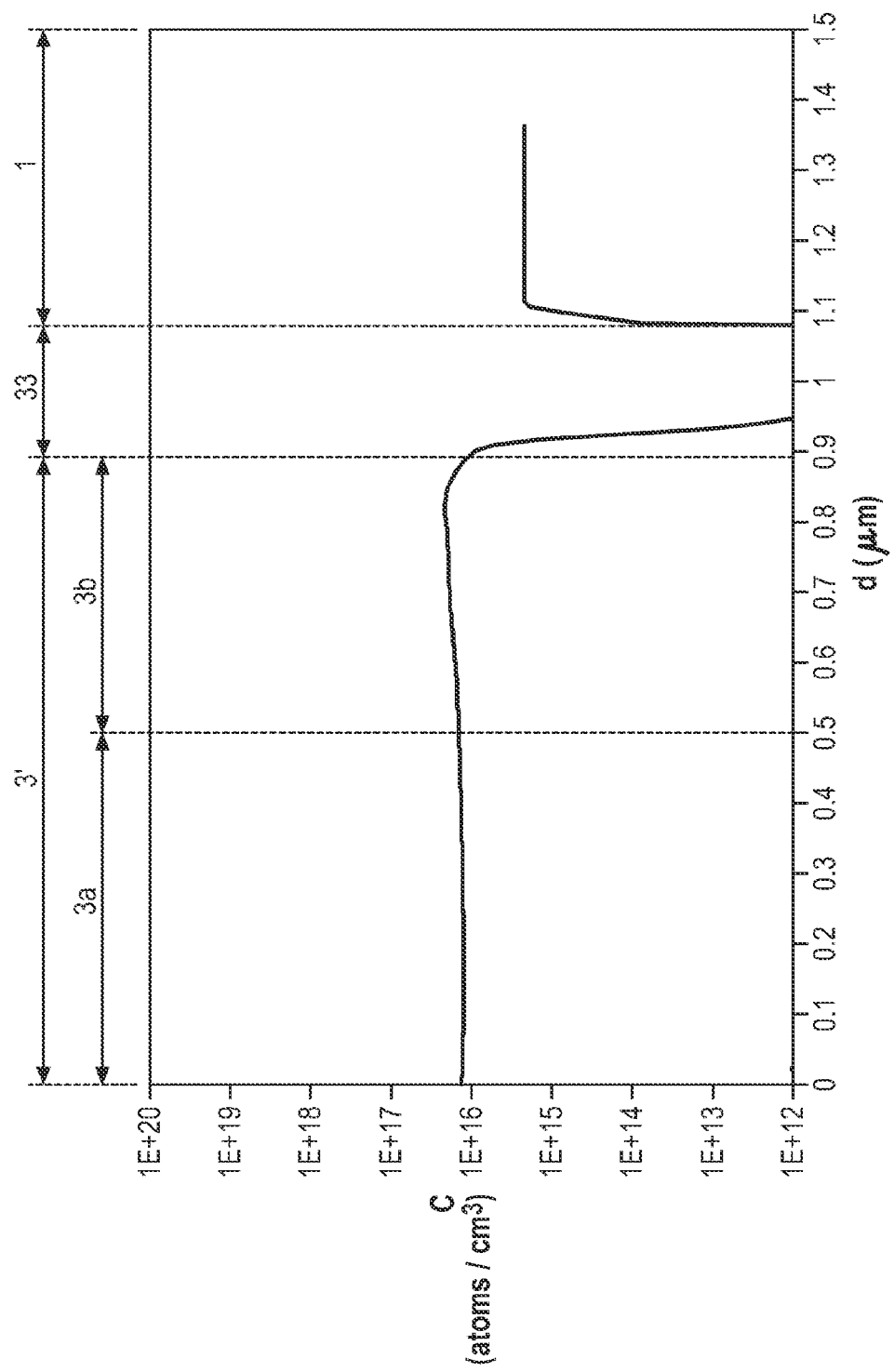

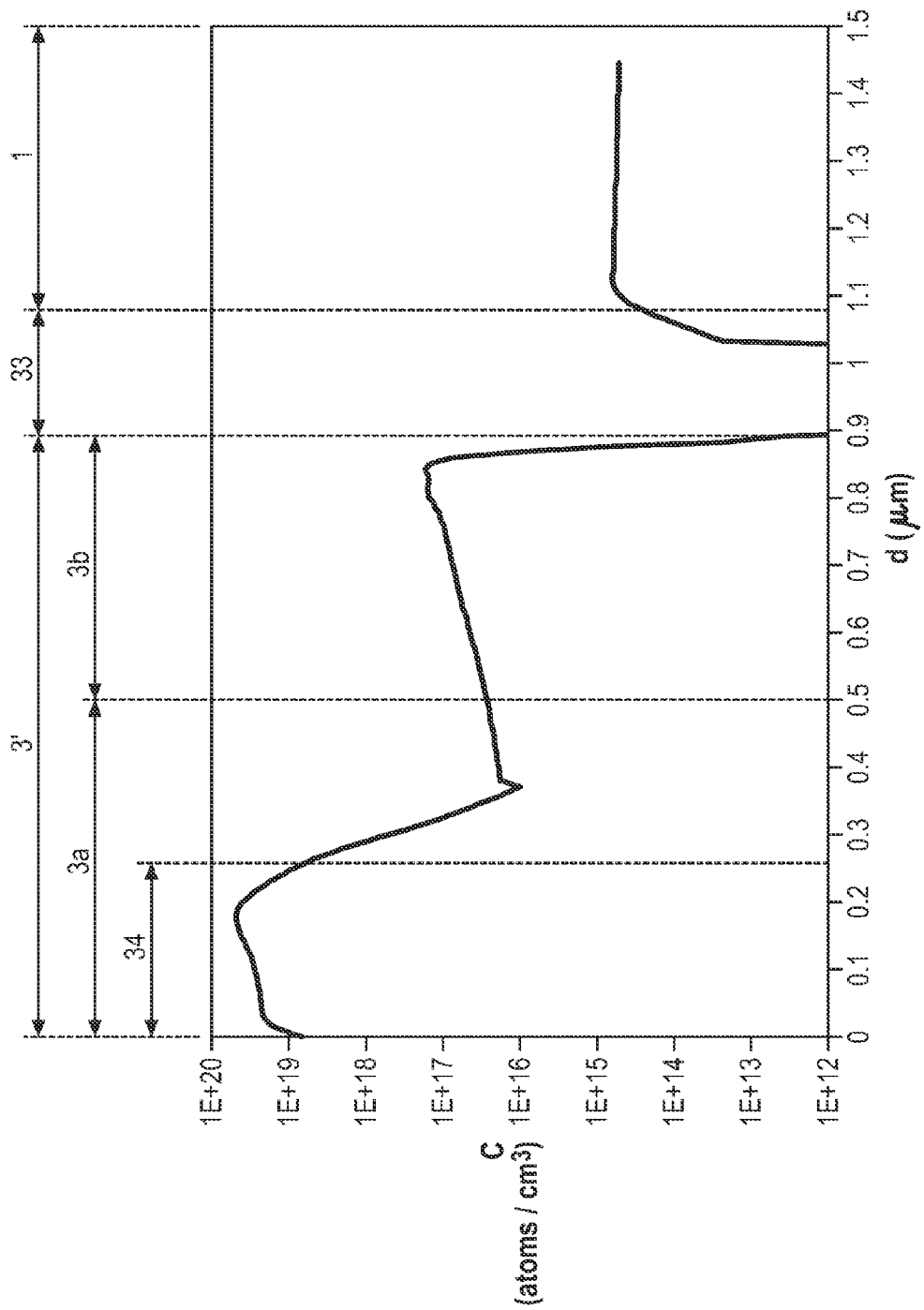

METHOD FOR TRANSFERRING A MONOCRYSTALLINE SEMICONDUCTOR LAYER ONTO A SUPPORT SUBSTRATE

FIELD OF THE INVENTION

The present invention relates to a method for transferring a monocrystalline semiconductor layer onto a support substrate and to a structure obtained by the method.

BACKGROUND OF THE INVENTION

The Smart Cut™ process is well-known in the art for transferring a semiconductor layer onto a support substrate, in particular for fabricating semiconductor on insulator (SeOI) structures, in particular silicon on insulator (SOI) structures.

Such structures successively comprise from their base toward their surface (i.e., their active part) a support substrate, a buried dielectric layer (generally, a buried oxide or BOX) and a semiconductor layer, referred to as the active layer, transferred from a substrate, referred to as the donor substrate.

More generally, the Smart-Cut™ process can be used to transfer a layer from a donor substrate to a support substrate. The Smart Cut™ process typically comprises the following steps:

1) forming an embrittlement zone in the donor substrate so as to delimit a surface layer of the donor substrate which constitutes the semiconductor layer to be transferred;
2) bonding the donor substrate onto the support substrate; when the formation of a SeOI structure is desired, at least one of the substrates is covered with a dielectric layer intended to form the BOX;
3) providing energy to the donor substrate so as to fracture it along the embrittlement zone, thus enabling the transfer of the semiconductor layer onto the support substrate; and
4) if need be, finishing by polishing, etching, annealing, etc. of the transferred semiconductor according to its use.

The embrittlement zone is generally formed by implanting atomic species in the donor substrate. Implantation may involve only one species (hydrogen, for example), but also several species, simultaneously or sequentially (hydrogen and helium, for example). In a manner known in the art, the implanted species are distributed across the thickness of the donor substrate according to a Gaussian distribution, i.e., with a peak corresponding to the maximum of species in the vicinity of the embrittlement zone. This implantation distribution is illustrated in FIG. 1, which represents donor substrate 31 covered with oxide layer 33 through which the implantation was carried out.

Embrittlement zone 32 obtained via implantation is located just below (relative to the surface through which implantation was carried out) the peak P corresponding to the maximum of implanted species. Semiconductor layer 3 to be transferred lies between oxide layer 33 and embrittlement zone 32. On each side of implantation peak P, donor substrate 31 contains a certain quantity of implanted atoms which decreases with distance from the peak.

In view of its use for forming electronic, optoelectronic or photovoltaic devices, depending on the applications concerned, the transferred semiconductor layer can be monocrystalline. Furthermore, the transferred layer can be doped or comprise a junction, i.e., a structure constituted of at least two adjacent layers with different doping levels. The transferred layer can thus comprise a p-n junction, an n-p-n junction, a p-n-p junction and/or any doped region for purposes of producing electronic devices.

It is known that implanted species have the effect of deteriorating the crystal lattice of the material of semiconductor layer 3 to be transferred. These defects in the crystal lattice are notably likely to alter the electrical behavior of the transferred semiconductor layer. These defects consist essentially of point defects: implantation creates Frenkel pairs (an interstitial defect plus a vacancy defect) which disorganize the lattice. The dopant atoms also leave their substitutional position and thus lose their electrical activity, referred to as deactivation.

The term "crystal defects" herein refers to these types of point defects as well as to extended defects ($\{311\}$ defects, dislocation loops) created by dynamic annealing during implantation or during subsequent annealing. By interacting with point defects (Frenkel pairs, dopants), these extended defects hinder the reactivation process.

Finally, the implanted atoms (H and/or He) themselves constitute point impurities (interstitial atoms) or extended impurities (platelet or $\{311\}$ defects) which also interact with dopants of the transferred layer.

To avoid these disadvantages, it is known in the art to apply to the structure comprising the semiconductor layer and the support substrate a high-temperature (i.e., greater than 800° C.) heat treatment after transferring the semiconductor layer to the support substrate. Such a heat treatment aims to correct crystalline defects and to restore the crystalline quality of the semiconductor layer, as well as to diffuse the residual atoms of species implanted outside the semiconductor layer.

There are situations, however, in which it is not possible to heat the structure comprising the transferred monocrystalline semiconductor layer to such a high temperature, for example, when a metal bonding layer is inserted between the support substrate and the semiconductor layer, or when the support substrate was treated beforehand to include electronic devices, interconnections, metal zones, etc., all of which would be damaged by the application of a high-temperature heat treatment. Furthermore, when the transferred layer comprises a doped region, for example a junction, it is also necessary to minimize thermal budget in order to avoid the diffusion of dopants from the layers forming the junction. Indeed, such diffusion would make the doping interfaces less abrupt and would deteriorate the operation of the device by modifying the electrical characteristics of the junction.

US patent publication 2005/0280155 describes a method for transferring a layer comprising a junction onto a support substrate comprising electronic devices. By applying a heat treatment at a moderate temperature, i.e., typically below 500° C., it is not sufficient to restore the electrical properties of the transferred semiconductor layer. Indeed, the presence of residual hydrogen from the implantation process hinders dopant reactivation when a simple low-temperature heat treatment is carried out.

US patent publication 2010/0044706 discloses a method for transferring a monocrystalline semiconductor layer onto a support substrate. This method involves:

amorphizing a buried portion of a monocrystalline semiconductor to be transferred from a donor substrate, without disorganizing the crystal lattice of a surface portion of the monocrystalline layer, implanting species in the donor substrate so as to form an embrittlement zone delimiting the monocrystalline layer to be transferred, bonding the donor substrate to the support substrate, fracturing the donor substrate at the embrittlement zone, so as to transfer the monocrystalline layer onto the support substrate, the portion that has been kept monocrystalline being at the interface with the support substrate and the amorphous portion being at the surface of the structure obtained after the transfer step, and recrystallizing the amorphous portion of the transferred monocrystalline layer, the crystal lattice of the underlying portion that has remained monocrystalline serving as a seed for recrystallization, the recrystallization being carried out at a temperature of between 550 and 600° C.

This recrystallization step of the amorphous portion is known in the art under the name of Solid Phase Epitaxy (SPE) and it has the effect of activating the dopants contained in the amorphous portion. In this method, however, the species that are implanted into the monocrystalline layer to form the embrittlement zone go through the portion that has been kept monocrystalline during the amorphisation step. As a consequence, the monocrystalline portion is damaged by the implanted species and, in particular, the dopants that it may contain are deactivated. Since this portion is not amorphous but monocrystalline, the damage will not be healed by the recrystallization step, and the dopants will not be reactivated in this portion, unless a conventional heat treatment is carried out at a high temperature.

One goal of the invention is thus to define a method for transferring a monocrystalline semiconductor layer onto a support substrate following which the transferred layer no longer contains the crystalline defects possibly generated by the embrittlement implantation. In particular, one goal of the invention is to restore to a transferred layer comprising a doped region its initial electrical properties, in spite of the dopant deactivation generated by the embrittlement implantation. Besides, the method should be able to be implemented entirely at moderate temperatures, i.e., not exceeding roughly 500° C. These methods are now described in the following text and claims.

SUMMARY OF THE INVENTION

The inventive method is designed for effectively transferring a monocrystalline semiconductor layer onto a support substrate. The method comprises implanting species through a surface of a donor substrate that includes monocrystalline semiconductor material to form therein an embrittlement zone delimiting a layer to be transferred; bonding the donor substrate to a support substrate; fracturing the donor substrate at the embrittlement zone to transfer the layer onto the support substrate; removing a surface portion of the transferred layer; treating the layer to obtain amorphisation of a first portion thereof without disorganizing the crystal lattice of a second portion thereof, with the first and second portions being, respectively, a surface portion and a buried portion of the donor substrate layer; and recrystallizing the amorphized first portion of the layer at a temperature that is below 500° C. to provide a crystal lattice therein. Advantageously, the non-disorganized second portion is present in a thickness sufficient to act as a seed layer for the recrystallizing of the first portion of the layer such that the first and second portions together provide a monocrystalline layer on the support substrate. Also, the thickness of the first portion of the layer is greater than the thickness of the transferred layer after the removal of the surface portion.

BRIEF DESCRIPTION OF THE DRAWINGS

Other characteristics and advantages of the invention will arise from the detailed description which follows, in reference to the annexed drawings wherein:

FIG. 1 is a diagram illustrating the conventional implantation distribution in the donor substrate;

FIGS. 2A to 2F illustrate various steps of the method according to one embodiment of the invention;

FIG. 9A shows the SRP profiles in the PN junction before and after hydrogen implantation;

FIG. 9B shows the SIMS profile of boron, phosphorus and hydrogen in the PN junction after hydrogen implantation;

FIG. 10A shows the SRP profile in the PN junction after transfer onto a support substrate;

FIG. 12A shows the SRP profile in the PN junction after amorphisation and recrystallization of a portion of the P layer.

DETAILED DESCRIPTION OF THE INVENTION

Figure 2C:
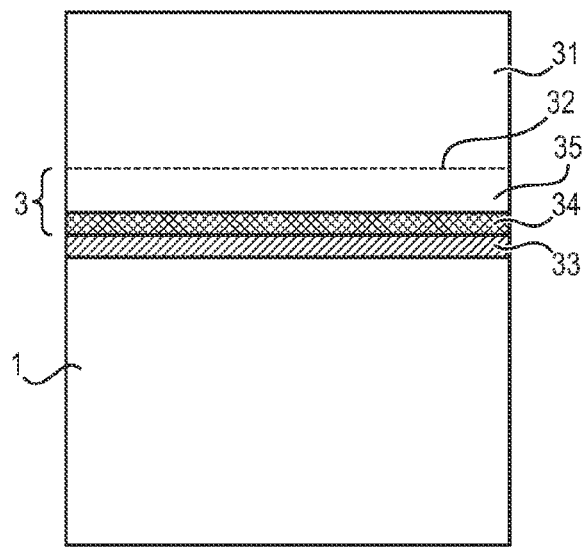

In accordance with the invention, a method is proposed for transferring a monocrystalline semiconductor layer onto a support substrate comprising the following successive steps:

(a) implanting species in a substrate, referred to as the donor substrate, so as to form in the donor substrate an embrittlement zone delimiting the monocrystalline layer to be transferred;

(b) bonding the donor substrate to the support substrate;

(c) fracturing the donor substrate at the embrittlement zone, so as to transfer the layer onto the support substrate;

(d) removing a surface portion of the transferred monocrystalline layer.

The method is remarkable in that it further comprises the following steps:

a first portion of the monocrystalline layer to be transferred is rendered amorphous, without disorganizing the crystal lattice of a second portion of the monocrystalline layer, the first and second portions being, respectively, a surface portion and a buried portion of the monocrystalline layer relative to the direction of implantation, the thickness of the first portion being greater than the thickness of the transferred monocrystalline layer after the removal of its surface portion carried out at step (d); and the first amorphous portion of the monocrystalline layer is recrystallized, the crystal lattice of the second portion serving as a seed for recrystallization, the recrystallization being carried out at a temperature below 500° C.

According to a first embodiment of the inventive method, amorphization of the first portion of the monocrystalline layer is implemented before the implantation step (a).

According to a second embodiment of the invention, amorphization of the first portion of the monocrystalline layer is implemented after the implantation step (a).

According to a particular embodiment, the amorphization of the first portion of the monocrystalline layer is implemented after the transfer step (c).

In a preferred manner, the amorphization comprises the implantation, in the first portion, of atomic species whose atomic number is greater than or equal to that of the semiconductor material of the monocrystalline layer.

According to a particular embodiment of the invention, the semiconductor material of the monocrystalline layer is silicon and the species implanted for amorphization of the first portion are selected among silicon, germanium, xenon and/or argon.

For example, the implanted species is silicon and the implanted dose is greater than or equal to $5 \times 10^{12}/cm^2$.

In a particularly advantageous manner, recrystallization of the first portion of the transferred layer is carried out by solid-phase epitaxy (SPE).

Furthermore, the donor substrate can advantageously be bonded to the support substrate via a bonding layer whose material is selected from metals, silicides and group III-V semiconductors, the bonding layer being deposited on the donor substrate after formation of the embrittlement zone and amorphization of the first portion of the monocrystalline layer to be transferred.

The temperature at which the bonding layer is deposited can be lower than the temperature at which the first portion begins to recrystallize. Alternatively, the temperature at which the bonding layer is deposited can be between the temperature at which the first portion begins to recrystallize and the temperature at which the donor substrate fracturing step is conducted.

After fracturing, a surface portion of the transferred monocrystalline semiconductor layer, damaged by the implantation is removed. Preferably, this removal is carried out after recrystallization.

According to an advantageous embodiment of the invention, the transferred semiconductor layer comprises a doped region, for example a junction. Furthermore, the support substrate can comprise an electronic device, an interconnection and/or a metal zone, as these are not likely to be damaged because of the low temperature at which recrystallization is implemented.

Finally, at step (d), the second portion of the monocrystalline layer is advantageously removed from the transferred layer, after recrystallization of the first portion, thus leaving a final monocrystalline layer that has been completely healed and/or reactivated by the amorphization/recrystallization steps.

The semiconductor layer to be transferred is typically a monocrystalline layer of a semiconductor material.

In the examples which will be described in detail below, the material is silicon but the invention also applies to any semiconductor material, including notably germanium, SiGe and group III-V materials such as GaN, GaAs, InP, etc.

The monocrystalline semiconductor layer is part of a donor substrate, which can be a solid substrate of the same material as that of the layer to be transferred, or a composite substrate, i.e., formed of a plurality of layers of different materials, wherein one comprises the semiconductor layer to be transferred.

The thickness of the semiconductor layer to be transferred is typically between 200 nm and 800 nm.

Preferably, the layer to be transferred comprises at least one doped region. For example, the layer to be transferred can comprise at least one p-n junction, one n-p-n junction, one p-n-p junction and/or any doped region for purposes of producing electronic devices.

The support substrate onto which the semiconductor layer is to be transferred can be any type of substrate, semiconductor or not.

The support substrate can be selected exclusively for its stiffening properties with respect to the semiconductor layer to be transferred, whose thickness is very small, but it can also have electrical and thermal properties selected as a function of the destination of the structure that it forms with the transferred layer.

In a particularly advantageous manner, the support substrate can comprise electronic devices, interconnections and/or metal zones formed before the transfer of the semiconductor layer.

Embrittlement of the Donor Substrate

In reference to FIG. 2A, embrittlement zone 32 delimiting layer 3 to be transferred is formed in donor substrate 31.

This embrittlement zone 32 is obtained by the implantation of atomic species (indicated by arrows) through layer 33 formed beforehand on one side of the donor substrate.

Generally, layer 33 is a layer whose function is to promote the subsequent bonding of the donor substrate onto the support substrate.

Layer 33 can be obtained by a process such as Low Pressure Chemical Vapor Deposition (LPCVD), Pressure Enhanced Chemical Vapor Deposition (PECVD) or electrochemical deposition.

According to the intended application, the layer 33 can be an electrically insulating layer (for example an oxide layer) or an electrically conducting layer (for example a metal layer). Layer 33 is, for example, formed by thermal oxidation of the donor substrate, but any other method for forming the layer can be used.

Implantation of the embrittlement zone can be carried out with a single species (for example hydrogen), but also with several species implanted sequentially (for example hydrogen and helium). Those persons skilled in the art can determine, according to the species to be implanted and the material of the semiconductor layer to be transferred, suitable implantation parameters (notably dose and energy).

Amorphization

Amorphization refers to disorganization of the crystal lattice of a region to a degree that the region loses all its crystalline nature. In reference to FIG. 2B, portion 34 of layer 3 to be transferred is rendered amorphous by means of an implantation of atomic species through layer 33 covering donor substrate 31.

The implantation conditions are selected so that portion 34 which is rendered amorphous is the surface portion of layer 3, adjacent to layer 33, and so that buried portion 35 of layer 3, located in the vicinity of embrittlement zone 32, remains monocrystalline. In other words, there is in the semiconductor layer only one interface between an amorphous region and a monocrystalline region.

Knowing that transferred layer 3 will be thinner after the transfer, for example by etching, polishing, etc., portion 34 which is rendered amorphous has a thickness greater than or equal to the final thickness of the active layer, the final layer being referred to as 3'.

To cause amorphization, the implanted species have an atomic number greater than or equal to the atomic number of the material of layer 3 and are preferably nondopant. The amorphization implantation is generally carried out at room temperature (300 K), but the thickness of the amorphous region can be influenced by modulating the temperature. For example, a temperature below 300 K promotes amorphization. For example, if layer 3 is of silicon, an implantation of silicon ions is preferred, but an implantation of germanium, xenon or argon can instead be employed.

The implanted dose is selected as a function of the desired thickness and depth of the layer of portion 34. For example, if layer 3 is of silicon, the dose of silicon implanted is preferably between $1\times10^{13}/cm^2$ and $5\times10^{15}/cm^2$. A silicon concentration greater than or equal to $5\times10^{19}/cm^3$ makes it possible to completely render amorphous portion 34.

Optionally, the implantation can be carried out sequentially, in two steps or more so as to implant the total dose desired. To render amorphous a given thickness, a sequential implantation has the advantage of limiting the implanted dose compared to a single implantation. In this case, at least two implantations whose energy is selected to have a peak at different depths of semiconductor layer 3 are carried out successively.

Figure 4A:
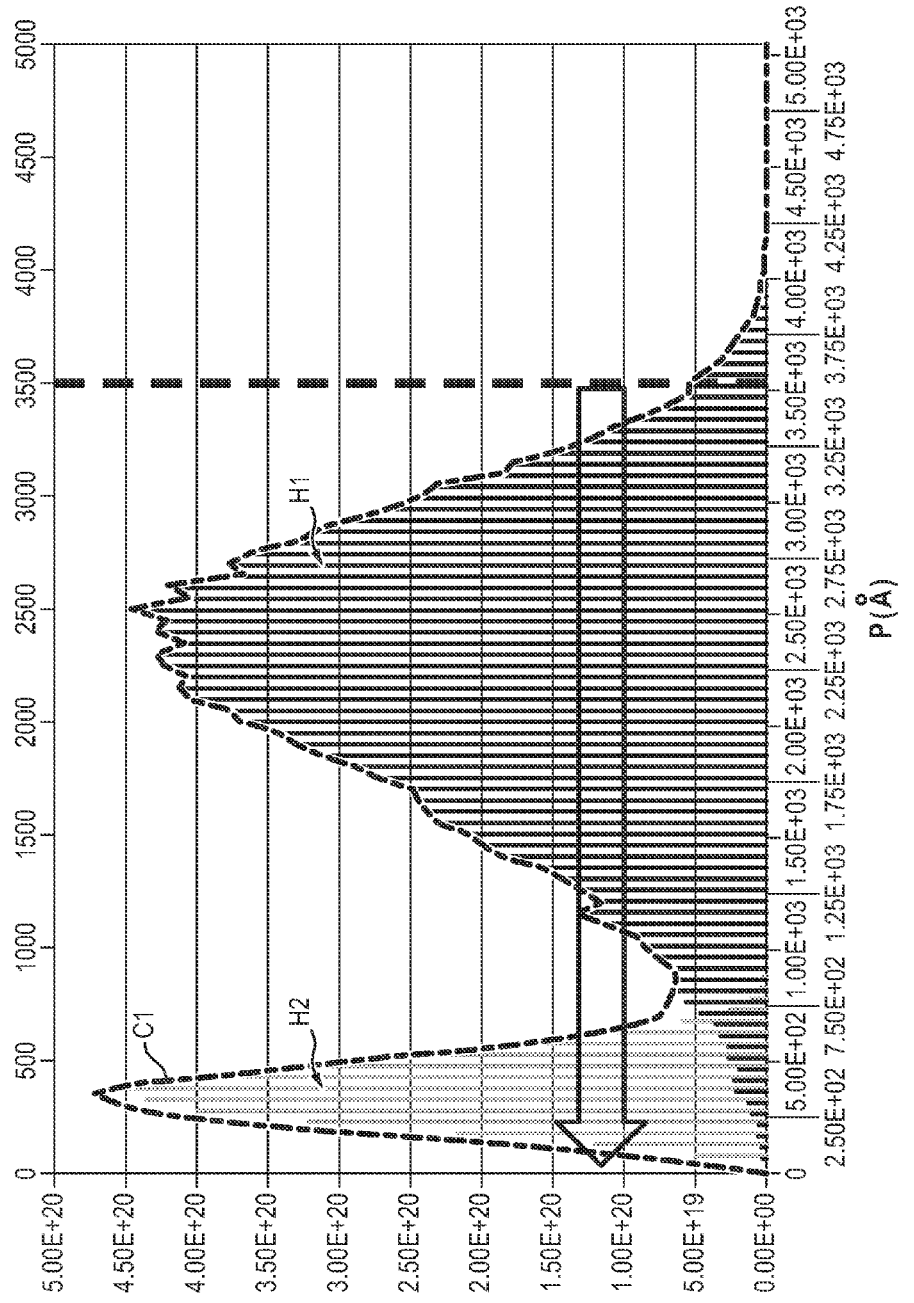
FIGS. 4A and 4B illustrate two simulations of the amorphization implantation of a portion of the monocrystalline layer to be transferred.
Figure 4B:
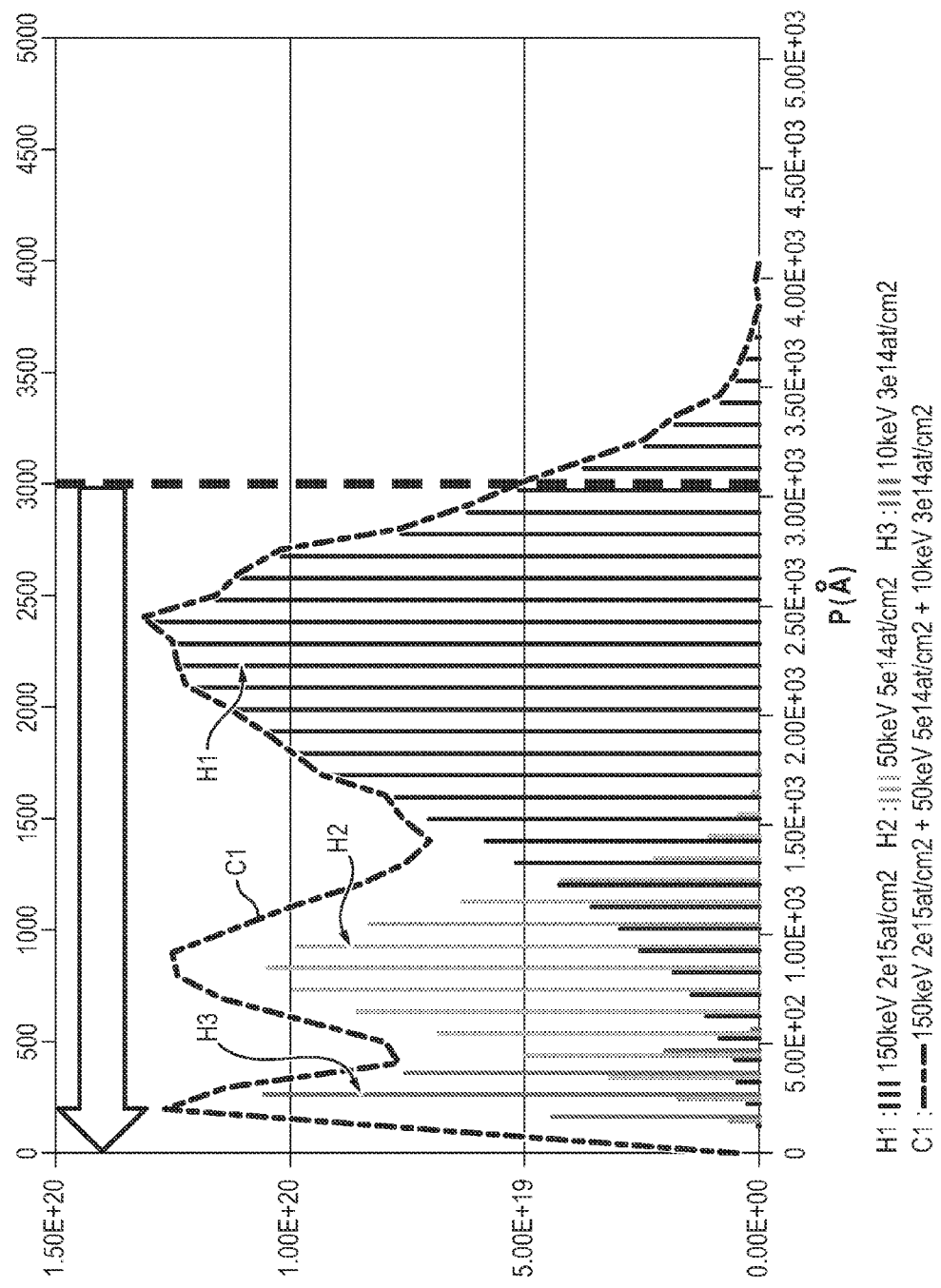

FIGS. 4A and 4B present two examples of simulations of the dose necessary to render amorphous a portion of given thickness of the semiconductor layer to be transferred. These simulations use the Monte Carlo method and the graphs present the concentration implanted (expressed per $cm^3$) as a function of the implantation depth p (expressed in angstroms). The dotted vertical line located at 3500 Å on the depth axis represents the embrittlement implantation peak. The wide arrow indicates the amorphous zone.

In FIG. 4A, two distinct implantations of silicon ions in a silicon substrate were simulated: the first implantation (histogram H1) is carried out with a dose of $7\times10^{15}/cm^2$ and an energy of 160 keV, the second (histogram H2) with a dose of $1.7\times10^{15}/cm^2$ and an energy of 20 keV. Curve C1 presents the implantation distribution obtained with these two successive implantations.

In FIG. 4B, three distinct implantations of silicon ions in a silicon substrate were simulated: the first implantation (histogram H1) is carried out with a dose of $2\times10^{15}/cm^2$ and an energy of 150 keV, the second (histogram H2) with a dose of $5\times10^{14}/cm^2$ and an energy of 50 keV, and the third (histogram H3) with a dose of $3\times10^{14}/cm^2$ and an energy of 10 keV. Curve C2 presents the implantation distribution obtained with these three successive implantations.

Figure 5:
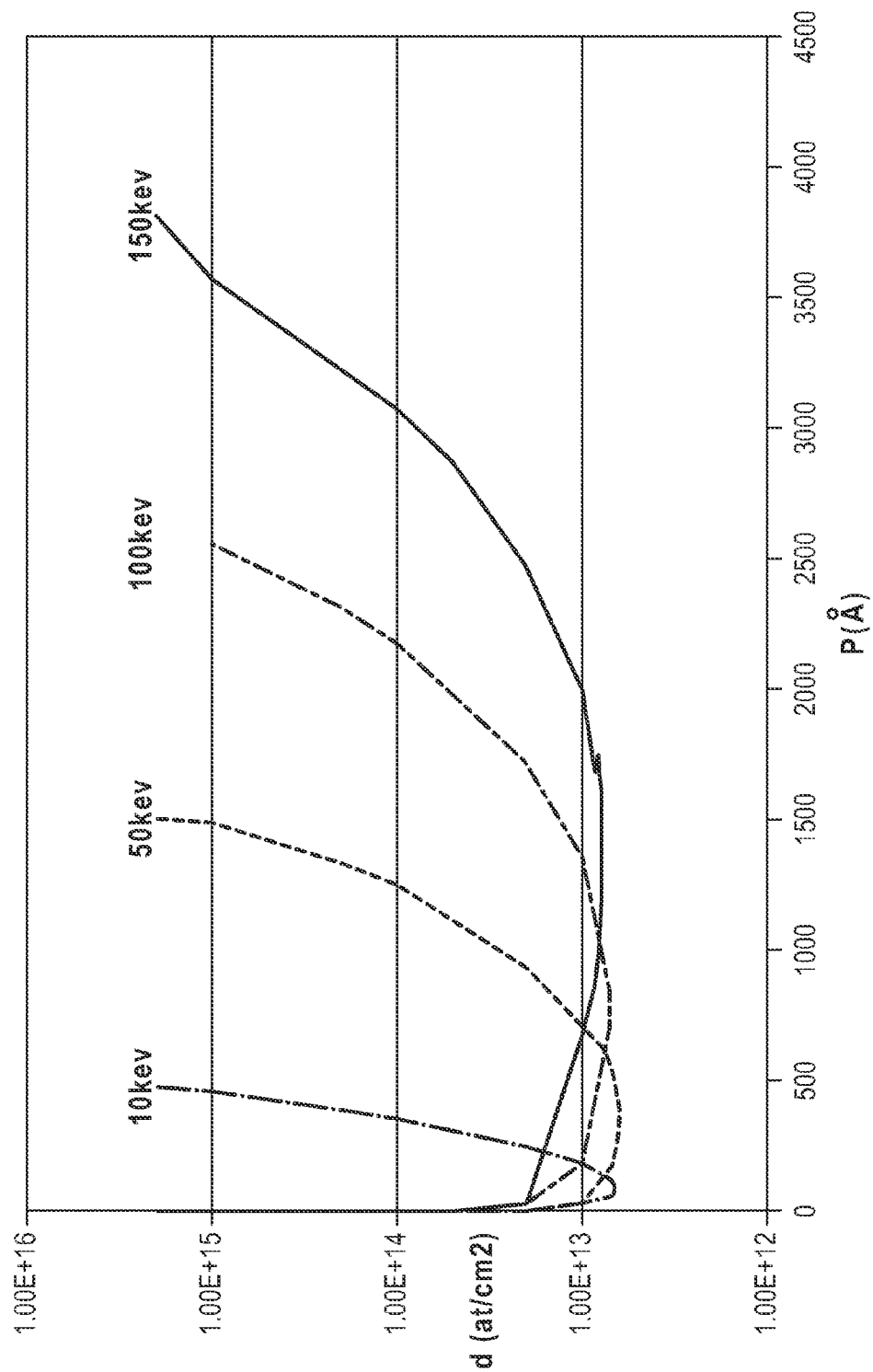
FIG. 5 presents curves of the dose to be implanted as a function of the depth of the region to undergo amorphization for various implantation energies.

FIG. 5 illustrates the dose d of hydrogen (in atoms/$cm^2$) to implant as a function of the depth p (in Å) in a silicon substrate for various energy values. To preserve monocrystalline portion 35 (which will serve as the seed layer for the subsequent recrystallization), the implantation energy is selected so that the maximum depth of the deepest implantation peak is less than the depth of embrittlement zone 32. Furthermore, care is taken to render amorphous portion 34 across its entire thickness from layer 33. Indeed, if a monocrystalline surface portion between layer 33 and amorphous portion 34 is preserved, there will be two recrystallization fronts (one from the surface portion and the other from portion 35), and lattice-mismatch defects will be generated at the interface between these two fronts.

Figure 3:
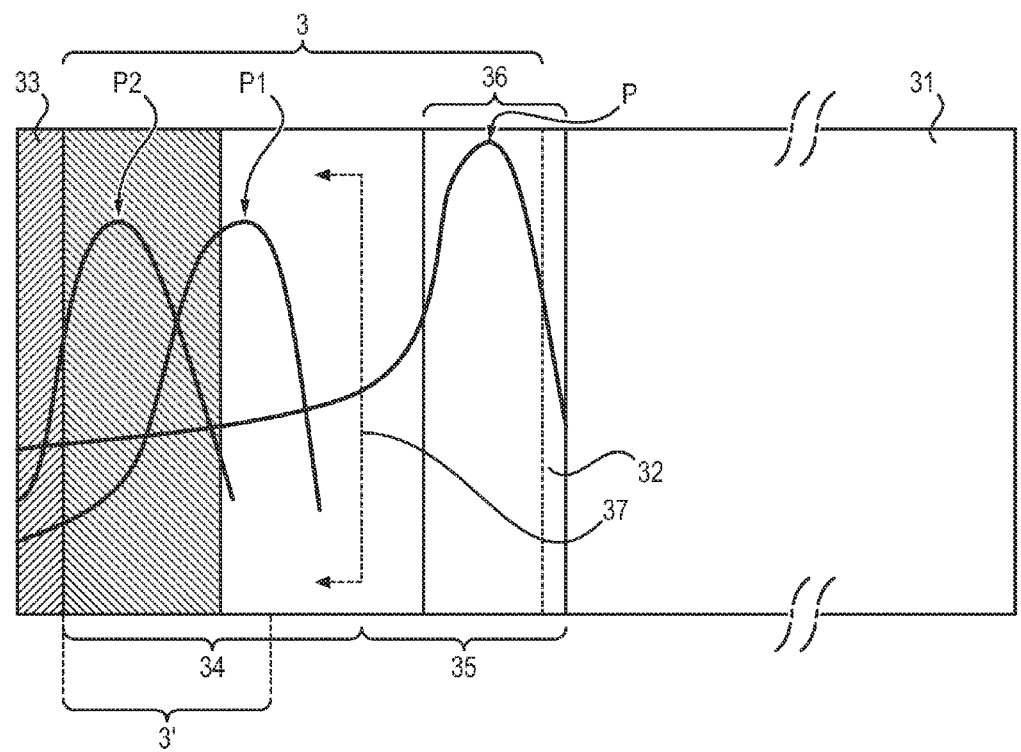
FIG. 3 illustrates the implantation distribution of species enabling the formation of the embrittlement zone and species creating the amorphization of a part of the monocrystalline layer to be transferred.

FIG. 3 illustrates the implantation distributions in donor substrate 31 of species enabling the formation of embrittlement zone 32 (peak P) and of species enabling the amorphization of portion 34 of the semiconductor layer to be transferred (peaks P1 and P2). The amorphization implantation was carried out in two steps, with peak P1, which is deepest, being located between less-deep peak P2 and embrittlement peak P. Border 37 separates amorphized portion 34 from portion 35, which remains monocrystalline.

Portion 36, which is closest to implantation peak P, was highly damaged by the embrittlement implantation. As will be seen below, this heavily damaged portion 36 will advantageously be removed after the transfer of semiconductor layer 3 onto the support substrate. Peak P1, the deepest of the amorphization implantation, should thus be preferably outside heavily damaged portion 36.

According to a particular embodiment of the invention, the amorphization step is carried out before the donor substrate embrittlement step. It is preferable, however, to proceed initially with the deepest implantation. The implantation sequence is thus advantageously comprised of the embrittlement implantation and then the amorphization implantation.

According to an embodiment, this amorphization step is carried out before the bonding and the transfer of the semiconductor layer onto the support substrate. This particular sequence makes it possible to more precisely control the position of portion 34 which is rendered amorphous and does not involve any risk of damage of the support substrate.

According to a preferred embodiment, however, the amorphization step is carried out after the transfer of the semiconductor layer onto the support substrate. In this case, care is to be taken to implement a sufficiently precise amorphization implantation to, on the one hand, not damage the support substrate (i.e. avoiding that implanted ions cross the bonding interface) and to, on the other hand, preserve, between the free surface of the semiconductor layer and the portion receiving the amorphization implantation, a monocrystalline portion serving as the seed for subsequent recrystallization. The implantation devices currently on the market are capable to provide the required precision of implantation and the skilled person is able to determine appropriate implantation parameters depending on the material of layer 3, on the implanted species and on the depth of implantation.

It is to be noted that when amorphization is carried out on the transferred layer, it is still the surface portion of this layer relative to the direction of the embrittlement implantation that has to be rendered amorphous; however, since the layer has been bonded to the support substrate via this surface portion, the corresponding portion of the transferred layer to amorphize is, in this case, buried at the bonding interface of the bonded structure.

The method steps of this embodiment are illustrated on FIGS. 7A and 7F and will be described in more detailed below.

Bonding

According to an embodiment, after the embrittlement and amorphization steps, donor substrate 31 is bonded onto support substrate 1.

This step, which is illustrated in FIG. 2C, can be preceded by any suitable treatment of the substrates (cleaning, plasma activation, etc.) to intensify bonding energy.

According to a particular embodiment illustrated herein, oxide layer 33 through which the embrittlement and amorphization implantations take place is located at the interface between the two substrates and fulfills the function of bonding layer.

Alternatively (not illustrated), if it is desired to implement bonding by means of a bonding layer in a material other than that of oxide layer 33 through which the embrittlement and amorphization implantations take place, the layer 33 is removed from donor substrate 31 by, for example, selective etching, polishing and/or any other technique, a bonding layer in the desired material is deposited on donor substrate 31 and/or onto support substrate 1 and substrates 31 and 1 are brought together via the bonding layer.

Such a bonding layer can comprise, for example, a metal, a silicide or a group III-V semiconductor material.

The bonding layer can be formed by any suitable deposition technique, for example thermal oxidation of the support substrate or deposition by a technique such as PECVD, Physical Vapor Deposition (PVD), Atomic Layer Deposition (ALD), LPCVD, Chemical Vapor Deposition (CVD) or Electrochemical Deposition (ECD) on the donor substrate or the support substrate. If deposition of the bonding layer is carried out on donor substrate 31, this deposition should preferably be implemented at a temperature below the temperature at which portion 34 of the semiconductor layer begins to recrystallize from monocrystalline portion 35, and at a temperature below the temperature at which the donor substrate is likely to fracture along embrittlement zone 32, which is itself lower than the recrystallization temperature. This makes it possible to dissociate the fracturing and recrystallization steps.

If deposition of the bonding layer can be implemented only at a high temperature, i.e., at a temperature greater than the temperature at which portion 34 of the semiconductor layer begins to recrystallize, it is carried out so that this deposition temperature remains below the temperature at which the donor substrate is likely to fracture along embrittlement zone 32, to avoid any premature fracturing of the donor substrate.

Bonding is carried out by bringing together the donor substrate and the support substrate, if need be by oxide layer 33 or another bonding layer such as described above. Bonding can consist of molecular bonding, thermocompression, or any other form of assembly. Bonding energy can be intensified by means of stabilization annealing.

According to another embodiment (see method described below referring to FIGS. 7A to 7F), the bonding is carried out after the embrittlement implantation but before amorphization.

Fracturing

The fracturing of donor substrate 31 along embrittlement zone 32 is preferably caused by the application of a heat treatment, which can be implemented following the stabilization annealing mentioned above. If necessary, the fracturing thermal energy is supplemented by mechanical, chemical or other energy.

Figure 2D:
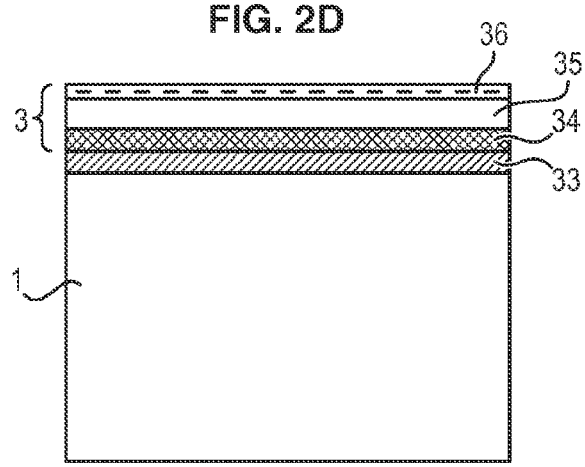

After having detached the remainder of the donor substrate, the structure illustrated in FIG. 2D is obtained. Portion 34, which was rendered amorphous, is buried in layer 3 at the bonding interface. Portion 35, whose monocrystalline nature was preserved, has at its surface portion 36, which was heavily damaged by the embrittlement implantation. The portion 36 can be removed from portion 35, for example by chemical-mechanical polishing (CMP).

Figure 2E:
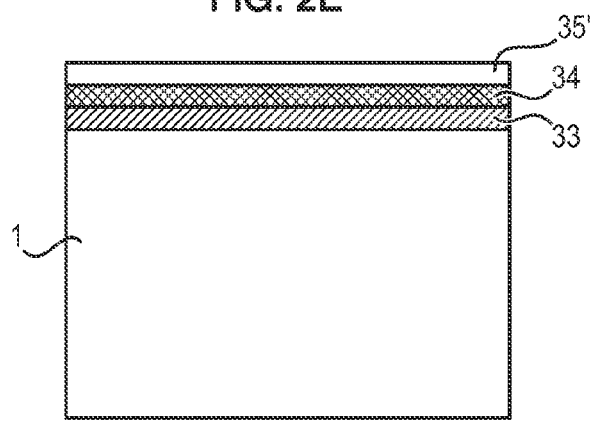

As illustrated in FIG. 2E, the transferred layer then comprises monocrystalline surface portion 35', lacking the majority of the defects related to implantation and fracturing, and amorphous buried portion 34. Alternatively, heavily damaged portion 36 can be removed from the transferred layer only after the buried portion 34 recrystallization step, which is described below. Advantageously, portion 36 is removed after the recrystallization of portion 34, because the chemical-mechanical polishing implemented at this time helps eliminate defects in the interface between the amorphous portion and the monocrystalline portion remaining at the end of the recrystallization process.

Recrystallization

Recrystallization refers to the process of returning to the amorphous layer portion its monocrystalline nature. The recrystallization of portion 34 is implemented by solid-phase epitaxy (SPE). This technique consists of, starting with a stack of an amorphous layer and a monocrystalline layer, carrying out a heat treatment at a temperature at which the crystal lattice of the amorphous layer reorganizes itself on the basis of the crystal lattice of the monocrystalline layer (which thus serves as a seed layer).

For silicon, the recrystallization of amorphous portion 34 begins at roughly 300° C.; portion 35 of the transferred layer, which remains monocrystalline, serves as a seed for this recrystallization. Insofar as there is in transferred layer 3 only one interface 37 between an amorphous portion and a monocrystalline portion, only one recrystallization front, which moves interface 37 toward the bonding interface, i.e., toward an increasing depth of the transferred layer, is formed.

During recrystallization, dislocation loops form at interface 37 between amorphous portion 34 and monocrystalline portion 35. These dislocation loops trap impurities as well as the residues of atoms (for example of hydrogen and/or helium) which were implanted for the embrittlement of the donor substrate. Furthermore, these dislocation loops also trap the crystalline defects generated in portion 36, which was heavily damaged by the implantation. Consequently, when this portion 36 is still present at the surface of layer 3 when the recrystallization step is carried out, the defects do not propagate in the recrystallized portion of transferred layer 3.

Furthermore, during the recrystallization heat treatment, recombination occurs with vacancy defects caused by light species implanted for embrittlement and interstitial defects caused by heavy species implanted to render amorphous portion 34. This recombination results in a crystalline defect rate distinctly lower than that obtained after only one embrittlement implantation or after only one amorphization implantation.

The recrystallization of portion 34 is advantageously initiated during the fracturing heat treatment. If necessary, it can be supplemented, after fracturing, by an additional heat treatment such as rapid thermal annealing (RTA) or microwave annealing (MWA), without exceeding the maximum temperature allowed by the application (for example 500° C.).

As seen above, recrystallization of portion 34 can optionally take place—or at least be initiated—before fracturing. This is notably the case when a bonding layer is deposited on the donor substrate at a temperature greater than the temperature at which portion 34 can recrystallize.

Finishing—Removal of a Surface Portion of the Transferred Layer

If portion 36, heavily damaged by the embrittlement implantation, was not removed before the transferred layer 3 recrystallization step, it can be after this step by means of any suitable technique such as chemical-mechanical polishing, for example. Besides, in this last removal step, the portion 35 of the transferred layer, that had been kept monocrystalline and has thus not been healed nor reactivated by the amorphisation-recrystallization, is also removed. Other finishing steps can optionally be applied to transferred layer 3, for example in order to further reduce its roughness.

Figure 2F:
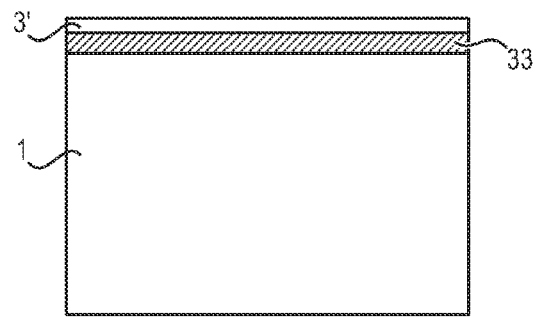

FIG. 2F shows the finished layer 3' on the support substrate, the layer 3' having a final thickness that is smaller than the thickness of the amorphized portion 34. Thus, the invention makes it possible, without applying to the semiconductor structure formed temperatures greater than 500° C., to correct defects related to embrittlement implantation in the transferred semiconductor layer. In particular, the implemented method makes it possible to evacuate residual hydrogen, to correct crystalline defects in the transferred layer and to reactivate dopants when the transferred layer comprises a doped region, for example a junction.

Figure 6:
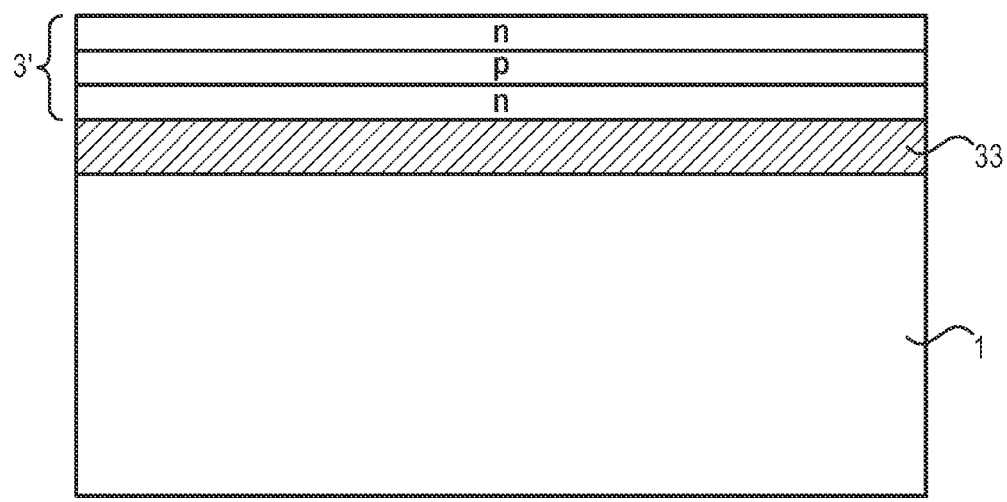
FIG. 6 illustrates a structure obtained by virtue of the invention, wherein the active layer comprises an n-p-n junction.

FIG. 6 illustrates a structure obtained by the inventive method, wherein active layer 3 comprises an n-p-n junction.

FIGS. 7A to 7F illustrate the steps of an alternative embodiment of the method, wherein amorphization is carried out after transfer of the layer onto the support substrate.

Although the order of the steps is thus different, the description of each step that was given above remains valid and reference is made to the corresponding paragraph above.

Figure 7A:
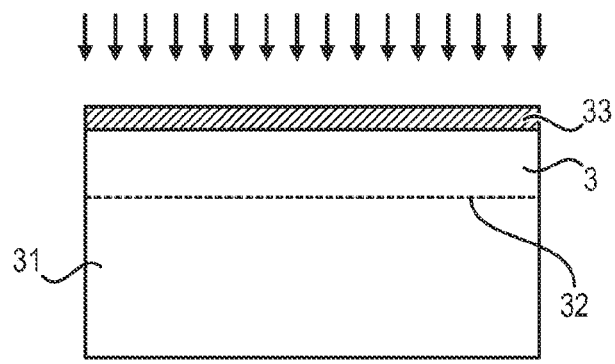
FIGS. 7A to 7F illustrate various steps of a method according to another embodiment of the invention.

FIG. 7A illustrates the embrittlement step. Ion implantation for the creation of the embrittlement zone 32 is carried out in the donor substrate 31. This step is similar as the one described with reference to FIG. 2A.

Figure 7B:
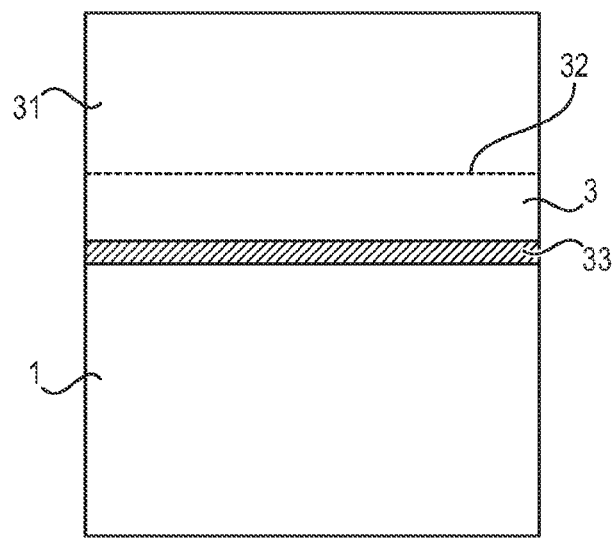

FIG. 7B illustrates the bonding step. The embrittled donor substrate 31 is bonded to the support substrate via the bonding layer 33. The upper portion of the layer 3 to be transferred, that corresponds to the surface portion of the layer 3 relative to the direction of implantation, is thus now buried in the structure shown on FIG. 7B.

Figure 7C:
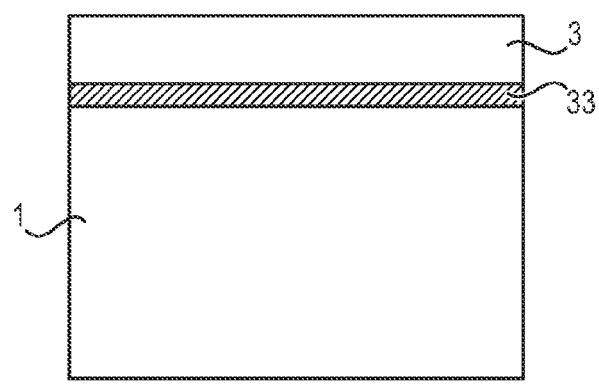

FIG. 7C illustrates the step of fracture of the donor substrate and transfer of the layer 3 onto the support substrate 1.

Figure 7D:
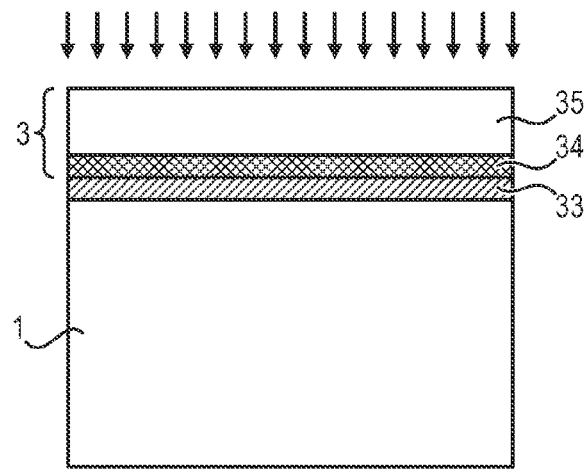

FIG. 7D illustrates the amorphisation step of the transferred layer 3. As mentioned above, since the surface portion of the transferred layer 3 relative to the direction of implantation is now buried in the bonded structure, the portion 34 to amorphize is also buried in the structure adjacent the bonding layer 33. This results in only one recrystallization front in the transferred layer.

Figure 7E:
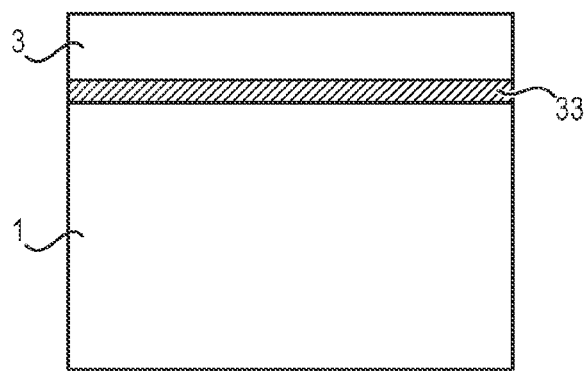

FIG. 7E illustrates the recrystallization step, showing the recrystallized layer 3. The seed for the recrystallization was the upper portion 35 of the layer as shown in FIG. 7D.

Figure 7F:
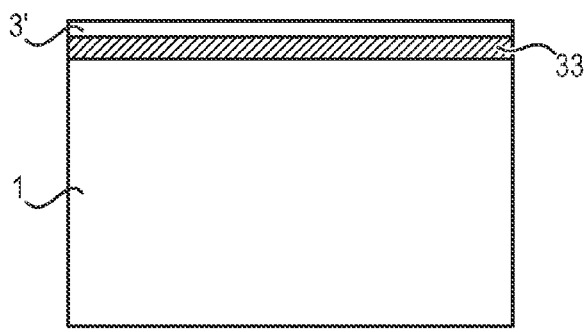

FIG. 7F illustrates the finishing step, including final removal of the portion of the transferred layer that has not been treated by the amorphisation-recrystallization treatment.

EXAMPLES

Experimental Results

To emphasize the effects of the method described above, comparative tests have been carried out between, on the one hand, a number of samples of an SOI substrate formed according a usual method (hereinafter referred to as "reference SOI"), and, on the other hand, samples of the reference SOI on which amorphization and recrystallization according to the invention have been implemented.

Figure 8:
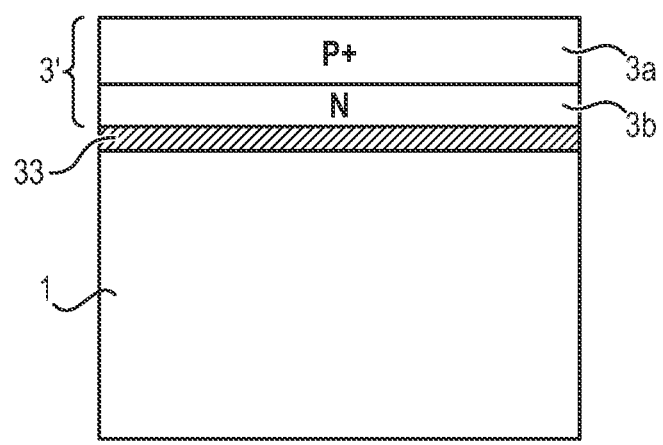
FIG. 8 illustrates a reference SOT substrate comprising a PN junction used in comparative experiments.

As shown on FIG. 8, the reference SOI comprises successively from its base toward its surface a silicon support substrate 1, a buried silicon oxide layer 33, and an active layer 3' consisting of a PN junction formed of a 0.5 μm thick P+ doped silicon layer 3a (the dopant being boron) over a 0.4 μm thick N doped silicon layer 3b (the dopant being phosphorus).

Several samples of this reference SOI have been fabricated by the Smart Cut™ process. In particular, hydrogen ions have been implanted in a donor substrate comprising at its surface the 0.4 μm thick N layer 3b (covered by the oxide layer 33) over the 0.5 μm thick P layer 3a, the implantation depth being about 1.1 μm; then the donor substrate was bonded, via the oxide layer 33, onto the silicon support substrate 1.

After transfer of the active layer onto the silicon support substrate 1, the layer has been subjected to chemical-mechanical polishing (CMP).

First, it has been shown that the presence of hydrogen (from the embrittlement implantation) in the active layer induces a deactivation of the dopants of the PN junction.

FIG. 9A shows the curves of an SRP measurement carried out on the PN junction (the N layer 3b being at the surface of the donor substrate) before hydrogen implantation (curve (a)) and after hydrogen implantation but before bonding to the support substrate (curve (b)), illustrating the concentration C of electrically active atoms (in atoms/cm$^3$) as a function of the depth d within the donor substrate (abscissa 0 corresponding to the upper surface of the donor substrate (N layer 3b)).

On curve (a), the N and P+ regions appear clearly.

On curve (b), the concentration of electrically active atoms has drastically fallen, showing that the hydrogen implantation has deactivated the dopants forming the PN junction.

FIG. 9B illustrates the concentration (in atoms/cm$^3$) of boron (B), phosphorus (P) (left ordinate axis) and hydrogen (H) (right ordinate axis) in the donor substrate measured by SIMS. Whereas SRP provides the concentration of electrically active atoms, SIMS provides the total concentration of atoms, regardless of their electrical activity. As expected, the P concentration is greater in the upper portion corresponding to the N layer 3b, whereas the B concentration is greater in the lower portion corresponding to the P+ layer 3a. The H peak concentration corresponds to the depth of the embrittlement zone, at about 1.1 μm.

FIG. 10A illustrates the concentration, measured by SRP, of electrically active atoms in the PN junction after its transfer to the support substrate 1 and implementation of the CMP polishing. The concentration is substantially constant over the whole transferred layer 3', providing a single N layer instead of the PN junction.

Figure 10B:
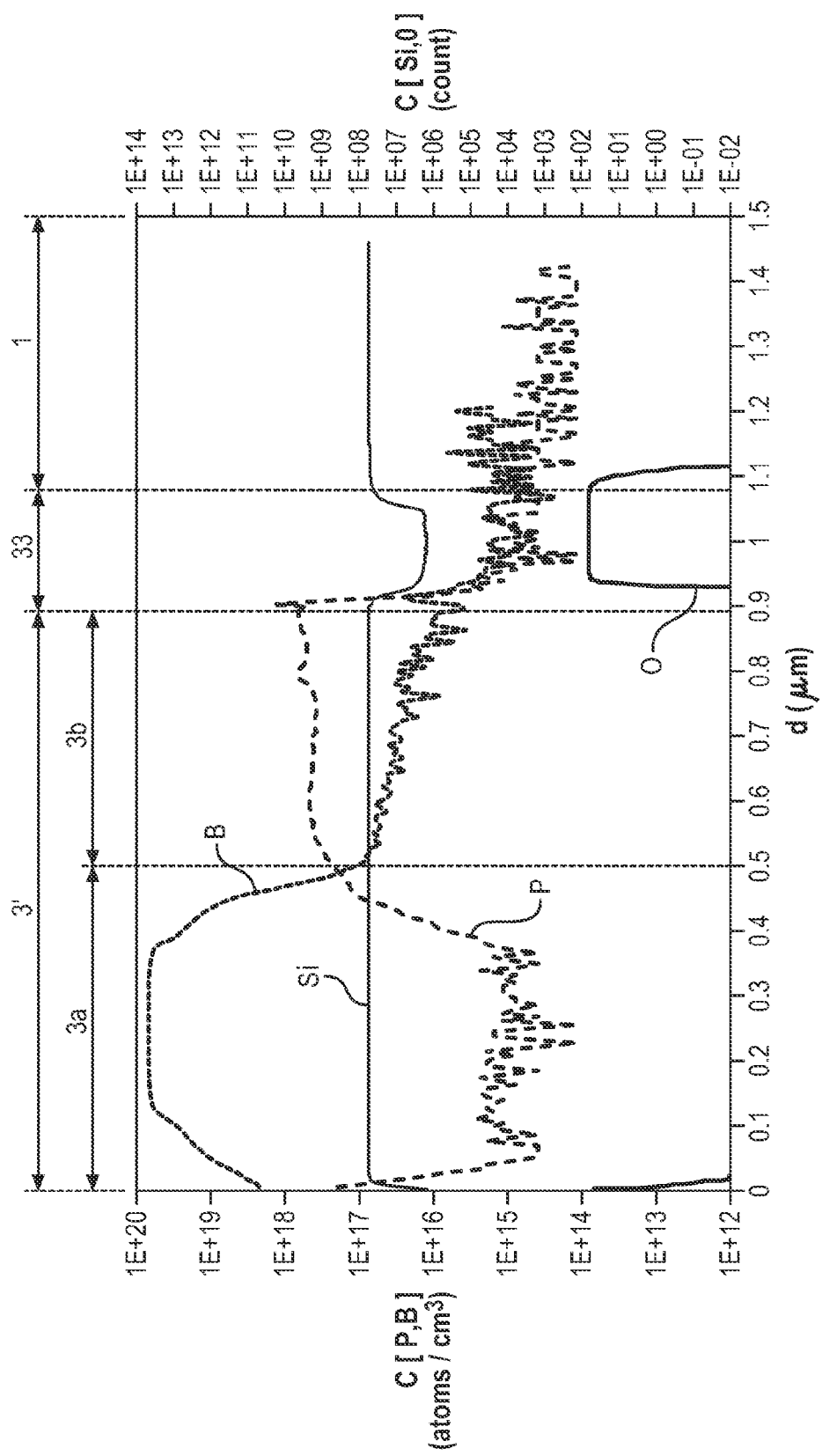
FIG. 10B shows the SIMS profile of boron and phosphorus in the PN junction after transfer onto a support substrate.

FIG. 10B illustrates the concentration, measured by SIMS, of B and P in atoms/cm$^3$ (left ordinate axis) and of Si and O atoms (count, right ordinate axis) in the transferred layer 3'.

A comparison of FIGS. 10A and 10B shows that the electrical activity of the B and P atoms does not coincide with their actual total concentration. In particular, the upper portion, which comprises boron, should provide a P type layer and not an N type one. This can be explained by the presence of recombining centers.

More details about the electronic behavior of hydrogen, that forms donors in silicon, which are supposed to lead to the apparition of recombining centers, can be found in "Theory of Hydrogen-Related Levels in Semiconductors and Oxides", C. G. Van de Walle, IEEE International Electron Devices Meeting (IEDM) Technical Digest, 2005, p. 400.

To investigate the effect of a local heating, some samples of the reference SOI have further been subjected to a laser annealing. Such a laser annealing consists in irradiating the surface of the SOI with a laser, with the effect of melting the silicon at the surface.

Figure 11:
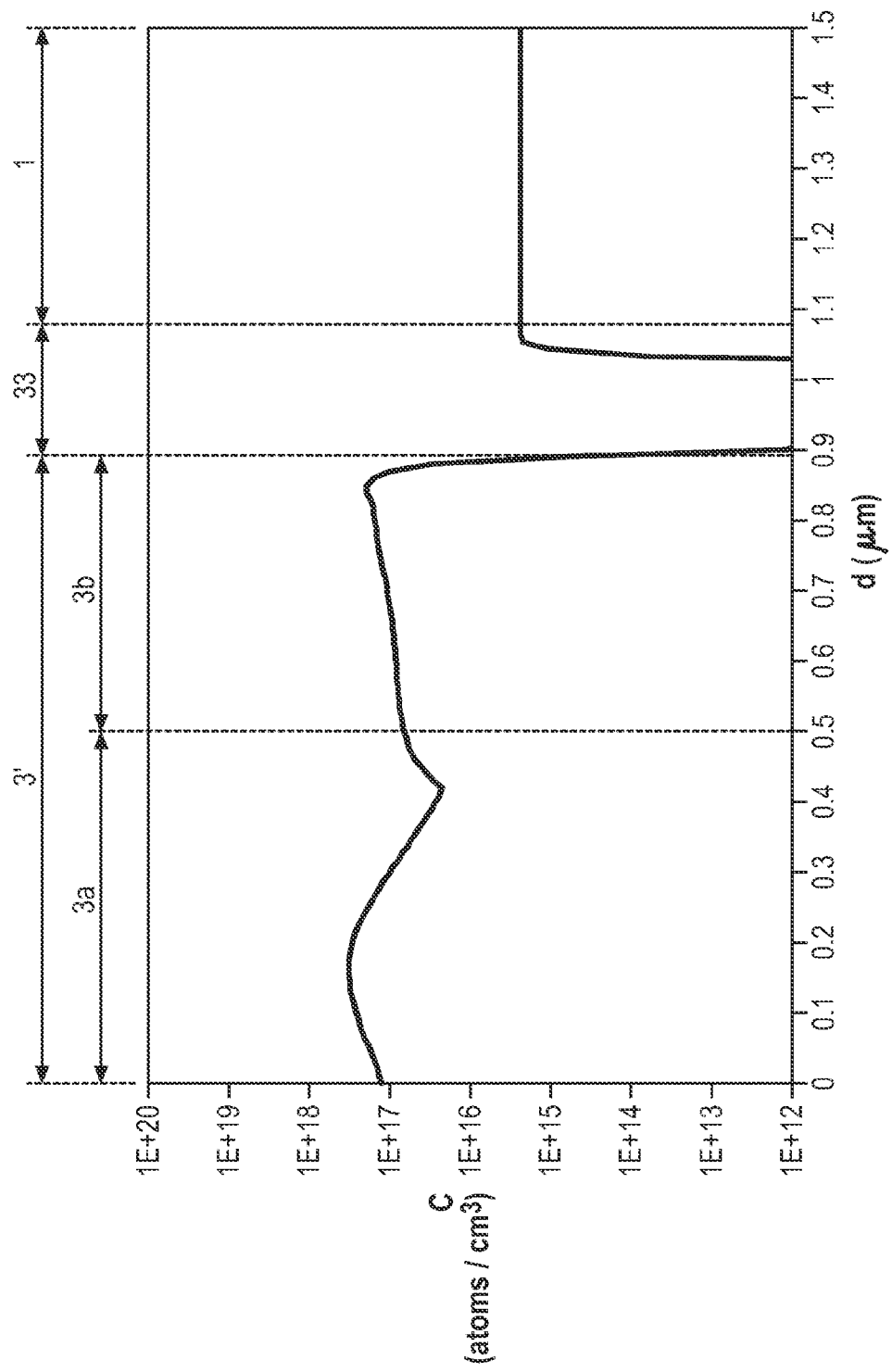
FIG. 11 shows the SRP profile in the PN junction after a laser annealing.

FIG. 11 illustrates the concentration, measured by SRP, of electrically active atoms in a laser annealed SOI. This figure shows that, even at the surface of the SOI, the profile is not the one of a P layer, meaning that boron has not been reactivated by the laser annealing. In addition, the laser annealing does not have any effect in more in-depth portions of the SOI.

In order to confirm the effect of the amorphisation followed from a recrystallization of the active layer, as provided by the invention, a portion of the active layer has been amorphized. For these tests, only a surface portion 34 of the P+ layer 3a, having a thickness of 0.25 μm, has been amorphized; the remainder of the active layer 3' being kept monocrystalline. To that end, an implantation of silicon atoms with a dose of 2×10$^{15}$ cm$^{-2}$ has been implanted with an energy of 150 keV. Then, this amorphous portion has been recrystallized by SPE at 500° C. during 10 hours.

FIG. 12A illustrates the concentration, measured by SRP, of electrically active atoms in the PN junction after recrystallization of amorphized portion 34. It can be seen that the concentration in electrically active B atoms is significantly greater than after transfer of the active layer onto the support substrate. This shows that the amorphisation-recrystallization treatment has been able to reactivate the dopants in the treated layer.

Figure 12B:
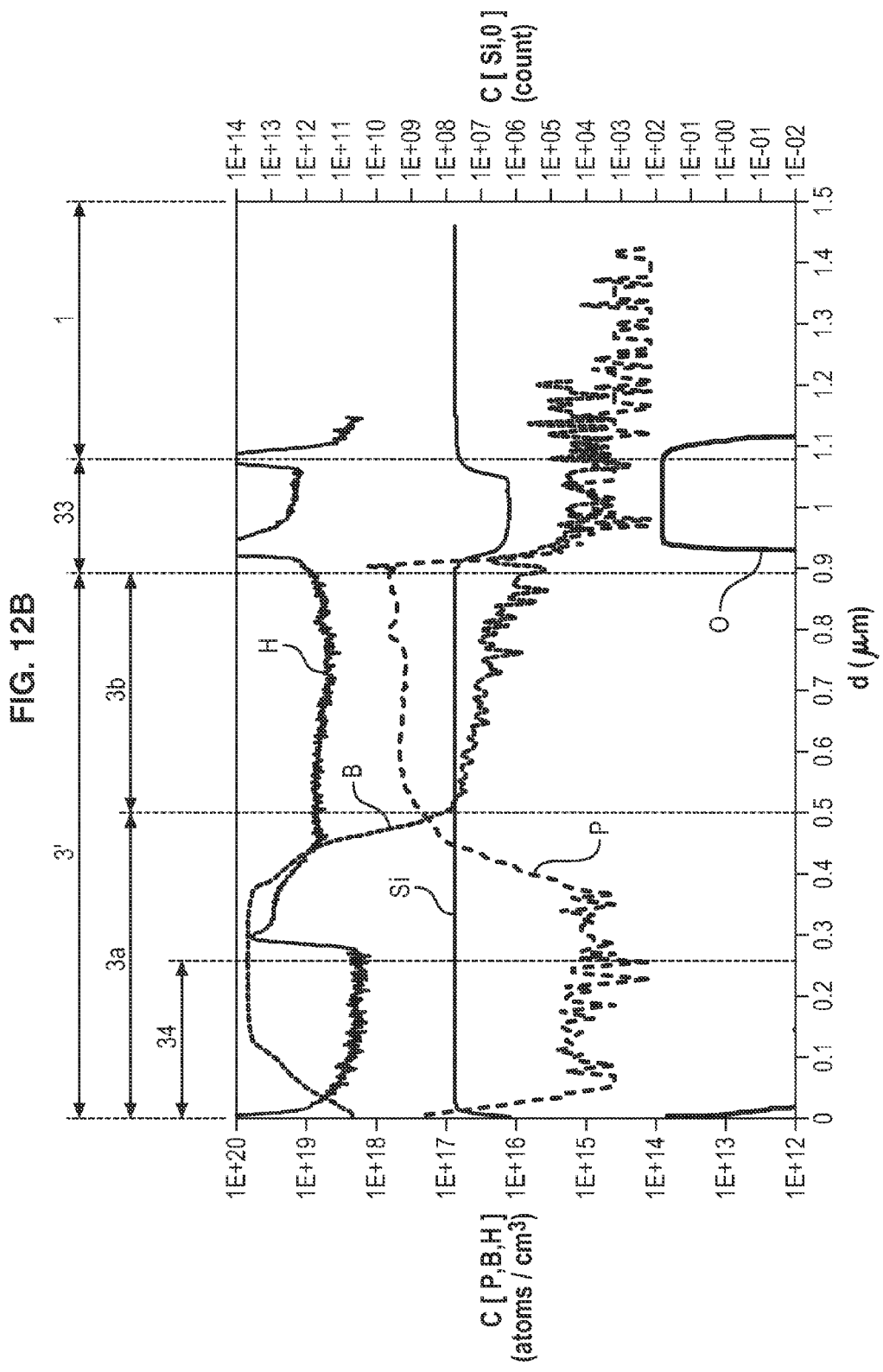
FIG. 12B shows the SIMS profile of boron, phosphorus and hydrogen in the PN junction after amorphisation and recrystallization of a portion of the P layer.

This is further confirmed by FIG. 12B, that illustrates the concentration, measured by SIMS, of B, P, and H in atoms/cm$^3$ (left ordinate axis) and Si and O atoms (count, right ordinate axis) in the transferred layer 3'. On this figure, it can be seen that the total concentration of B atoms is substantially similar to the concentration of electrically active B atoms, which shows that B atoms have been reactivated. It can also be seen that the H concentration has dramatically decreased in portion 34 that has been amorphized then recrystallized. Indeed, the H concentration shown on FIG. 12A corresponds to the limit of detection of the SIMS device. The evacuation of H atoms is due to the rearrangement of the atoms during recrystallization of the amorphized layer.

FIGS. 12A and 12B thus show that the evacuation of hydrogen has a direct effect on reactivation of the dopants and recovery of the electrical activity of a doped layer.

It is to be noted that these experimental results have been given only as a demonstration of the effect of the invention. Of course, the invention is not limited to the above embodiment.

What is claimed is:

1. A method for transferring a monocrystalline semiconductor layer onto a support substrate, which comprises:
   implanting species through a surface of a donor substrate that includes monocrystalline semiconductor material to form therein an embrittlement zone delimiting a layer to be transferred, with the layer to be transferred comprising first and second portions, the first portion including a surface portion and the second portion including a buried portion;
   bonding the donor substrate to a support substrate;
   fracturing the donor substrate at the embrittlement zone to transfer the layer onto the support substrate;
   removing a surface portion of the transferred layer, wherein the first portion has a thickness that is greater than that of the transferred layer after the removal of the surface portion so that part of the first portion remains on the support substrate;
   treating the layer to obtain amorphisation of the first portion without disorganizing the crystal lattice of the second portion, and
   recrystallizing the amorphized first portion of the transferred layer at a temperature that is below 500° C. to provide a crystal lattice therein, wherein the recrystallizing is carried out after the implanting of species through the surface of the donor substrate.

2. The method according to claim 1, wherein the non-disorganized second portion is present in a thickness sufficient to act as a seed layer for the recrystallizing of the first portion of the transferred layer such that the first and second portions together provide a monocrystalline layer on the support substrate.

3. The method according to claim 1, wherein the first portion of the layer is amorphized prior to the implanting.

4. The method according to claim 1, wherein the first portion of the layer is amorphized after the implanting.

5. The method according to claim 1, wherein the first portion of the layer is amorphized after the layer is transferred.

6. The method according to claim 1, wherein the first portion of the layer is amorphized by the implanting of atomic species whose atomic number is greater than or equal to that of the semiconductor material of the layer.

7. The method according to claim 6, wherein the semiconductor material of the layer is one of silicon and the implanted species for amorphizing the first portion of the layer is silicon, germanium, xenon or argon.

8. The method according to claim 7, wherein the implanted species is silicon and the implanted dose is greater than or equal to $5\times10^{12}/cm^2$.

9. The method according to claim 1, wherein the recrystallization of the amorphized first portion of the layer is carried out by solid-phase epitaxy.

10. The method according to claim 1, wherein the donor substrate is bonded to the support substrate via a bonding layer whose material is selected from one of metals, silicides and group III-V semiconductors, with the bonding layer deposited on the donor substrate after formation of the embrittlement zone and amorphization of the first portion of the monocrystalline layer to be transferred.

11. The method according to claim 10, wherein the temperature at which the bonding layer is deposited is lower than the temperature at which the first portion begins to recrystallize.

12. The method according to claim 10, wherein the temperature at which the bonding layer is deposited lies between the temperature at which the first portion begins to recrystallize and the temperature at which the donor substrate fracturing step is conducted.

13. The method according to claim 10, wherein the bonding layer is applied to the donor substrate prior to the implanting.

14. The method according to claim 1, wherein the removal is carried out after recrystallization.

15. The method according to claim 1, wherein the transferred semiconductor layer comprises a doped region or junction.

16. The method according to claim 1, wherein the support substrate comprises one of an electronic device, an interconnection or a metal zone.

17. The method according to claim 1, which further comprises removing the second portion from the layer after recrystallization of the first portion.

* * * * *

UNITED STATES PATENT AND TRADEMARK OFFICE
CERTIFICATE OF CORRECTION

PATENT NO.         : 8,603,896 B2                                            Page 1 of 1
APPLICATION NO.    : 13/559396
DATED              : December 10, 2013
INVENTOR(S)        : Gaudin et al.

It is certified that error appears in the above-identified patent and that said Letters Patent is hereby corrected as shown below:

In the Claims

Column 13:
Lines 37-40 (claim 1, lines 14-17), delete "wherein the first portion has a thickness that is greater than that of the transferred layer after the removal of the surface portion so that part of the first portion remains on the support substrate;" and insert -- so that part of the first portion of the transferred layer after the removal of the surface portion remains on the support substrate; --.

Signed and Sealed this
Twenty-fifth Day of February, 2014

Michelle K. Lee
*Deputy Director of the United States Patent and Trademark Office*